(12) United States Patent
Hung et al.

(10) Patent No.: US 7,687,898 B2
(45) Date of Patent: Mar. 30, 2010

(54) STACKED SEMICONDUCTOR PACKAGE

(75) Inventors: Sung-Ching Hung, Kaohsiung (TW); Wen-Pin Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 74 days.

(21) Appl. No.: 12/029,533

(22) Filed: Feb. 12, 2008

(65) Prior Publication Data

US 2008/0191330 A1    Aug. 14, 2008

(30) Foreign Application Priority Data

Feb. 13, 2007    (TW) .............................. 96105161 A

(51) Int. Cl.
*H01L 23/02* (2006.01)
(52) U.S. Cl. .................... 257/686; 257/777; 257/784
(58) Field of Classification Search ................ 257/784, 257/786, 666, 686, 777, 723, 724, 691
See application file for complete search history.

(56) References Cited

U.S. PATENT DOCUMENTS

2005/0200009 A1*   9/2005  Kang et al. .................. 257/734
2007/0166877 A1*   7/2007  Otremba ...................... 438/106

\* cited by examiner

*Primary Examiner*—S. V Clark
(74) *Attorney, Agent, or Firm*—Volentine & Whitt, P.L.L.C.

(57) ABSTRACT

A stacked semiconductor package, includes a carrier, a first semiconductor device, a second semiconductor device, a plurality of first wires and a plurality of second wires. The carrier has a plurality of electrically connecting portions. The first semiconductor device has a plurality of first pads. The second semiconductor device has a plurality of second pads. The second semiconductor device is disposed on the first semiconductor device. The first wires electrically connect the first pads of the first semiconductor device and the electrically connecting portions of the carrier, and the second wires electrically connect the second pads of the second semiconductor device and the electrically connecting portions of the carrier. The diameters of the second wires are larger than those of the first wires. Thus, the material of the wires is reduced, and the manufacturing cost is reduced.

20 Claims, 6 Drawing Sheets

US 7,687,898 B2

STACKED SEMICONDUCTOR PACKAGE

BACKGROUND OF THE INVENTION

1. Field of the Invention

The present invention relates to a stacked semiconductor package, and more particularly to a stacked semiconductor package having wires with different diameters.

2. Description of the Related Art

FIG. 1 shows a top view of a conventional stacked semiconductor package without a molding compound. FIG. 2 shows a cross-sectional view of the conventional stacked semiconductor package. The conventional stacked semiconductor package 1 comprises a substrate 11, a first die 12, a second die 13, a plurality of first wires 14, a plurality of second wires 15 and a molding compound 16.

The upper surface of the substrate 11 has a plurality of fingers 111, a ground ring 112 and a power ring 113. The fingers 111, the ground ring 112 and the power ring 113 surround the first die 12 and the second die 13. The lower surface of the first die 12 is adhered to the upper surface of the substrate 11 by an adhesive 17. The upper surface of the first die 12 has a plurality of first pads 121. The first wires 14 electrically connect the first pads 121 to the ground ring 112 or the power ring 113.

The lower surface of the second die 13 is adhered to the upper surface of the first die 12 by an adhesive 18. The upper surface of the second die 13 has a plurality of second pads 131. The second wires 15 electrically connect the second pads 131 to the fingers 111, the ground ring 112 or the power ring 113. The molding compound 16 encapsulates the upper surface of the substrate 11, the first die 12, the second die 13, the first wires 14 and the second wires 15.

The conventional stacked semiconductor package 1 has the following disadvantages. The diameters of the first wires 14 and the second wires 15 are the same, causing a waste of material. In particular, the material of the conventional wires is almost always gold, and this increases the manufacturing cost. Moreover, the first wires 14 cannot be arranged with an arc that has a small radius, or the neck would be easily torn apart, but if the radius of the arc of the first wires 14 is too large, the first wires 14 would have a risk of touching the second wires 15.

Therefore, it is necessary to provide an innovative and advanced stacked semiconductor package to solve the above problems.

SUMMARY OF THE INVENTION

The present invention is directed to a stacked semiconductor package, which comprises a carrier, a first semiconductor device, a second semiconductor device, a plurality of first wires and a plurality of second wires. The carrier has a plurality of electrically connecting portions. The first semiconductor device has a plurality of first pads. The second semiconductor device has a plurality of second pads, and the second semiconductor device is disposed on the first semiconductor device. The first wires electrically connect the first pads of the first semiconductor device and the electrically connecting portions of the carrier. The second wires electrically connect the second pads of the second semiconductor device and the electrically connecting portions of the carrier, and the diameters of the second wires are larger than those of the first wires. Thus, the material of the wires is reduced, and the manufacturing cost is reduced. Moreover, the diameters of the first wires are rather small, so that the radius of the arc thereof is effectively reduced, and it is less possible for the neck to be torn apart.

DETAILED DESCRIPTION OF THE INVENTION

The present invention relates to a stacked semiconductor package, which comprises a carrier, a first semiconductor device, a second semiconductor device, a plurality of first wires and a plurality of second wires.

The carrier has a plurality of electrically connecting portions. In the present invention, the carrier may be a substrate or a leadframe. When the carrier is a substrate, the first semiconductor device is directly adhered to the upper surface of the substrate, and the second semiconductor device is disposed on the first semiconductor device. Meanwhile, the electrically connecting portions are a plurality of fingers, a ground ring or a power ring.

When the carrier is a leadframe, which has a die pad, the first semiconductor device is adhered to the die pad, and the second semiconductor device is disposed on the first semiconductor device. Meanwhile, the electrically connecting portions are a plurality of leads, a ground ring or a power ring.

The first semiconductor device has a plurality of first pads. The first semiconductor device is preferably a first die. The areas of the first pads may be all the same or different. Moreover, the first pads may be arranged into one row or multi-rows. The second semiconductor device has a plurality of second pads. The second semiconductor device is preferably a second die. The areas of the second pads may be all the same or different. Moreover, the second pads may be arranged into one row or multi-rows.

The first wires electrically connect the first pads of the first semiconductor device and the electrically connecting portions of the carrier. The second wires electrically connect the second pads of the second semiconductor device and the electrically connecting portions of the carrier, and the diameters of the second wires are larger than those of the first wires. For example, the diameters of the first wires are less than 0.9 times the diameters of the second wires. The diameter of the first wire is designed according to its strength, so that the first wire maintains its form in the molding procedure against the molding material flow. The lengths of the second wires are preferably larger than those of the first wires, and the areas of the second pads touched by the second wires are larger than those of the first pads touched by the first wires.

The present invention has the following advantages. The diameters of the second wires are different from those of the first wires, so that the material of the wires is reduced, and the manufacturing cost is reduced. Moreover, the diameters of the first wires are smaller, so that the radius of the arc is effectively reduced, and it is less possible for the neck to be torn apart.

The present invention is illustrated in detail by the following examples, but it's not restricted by the content of the examples.

Example 1

Figure 1:
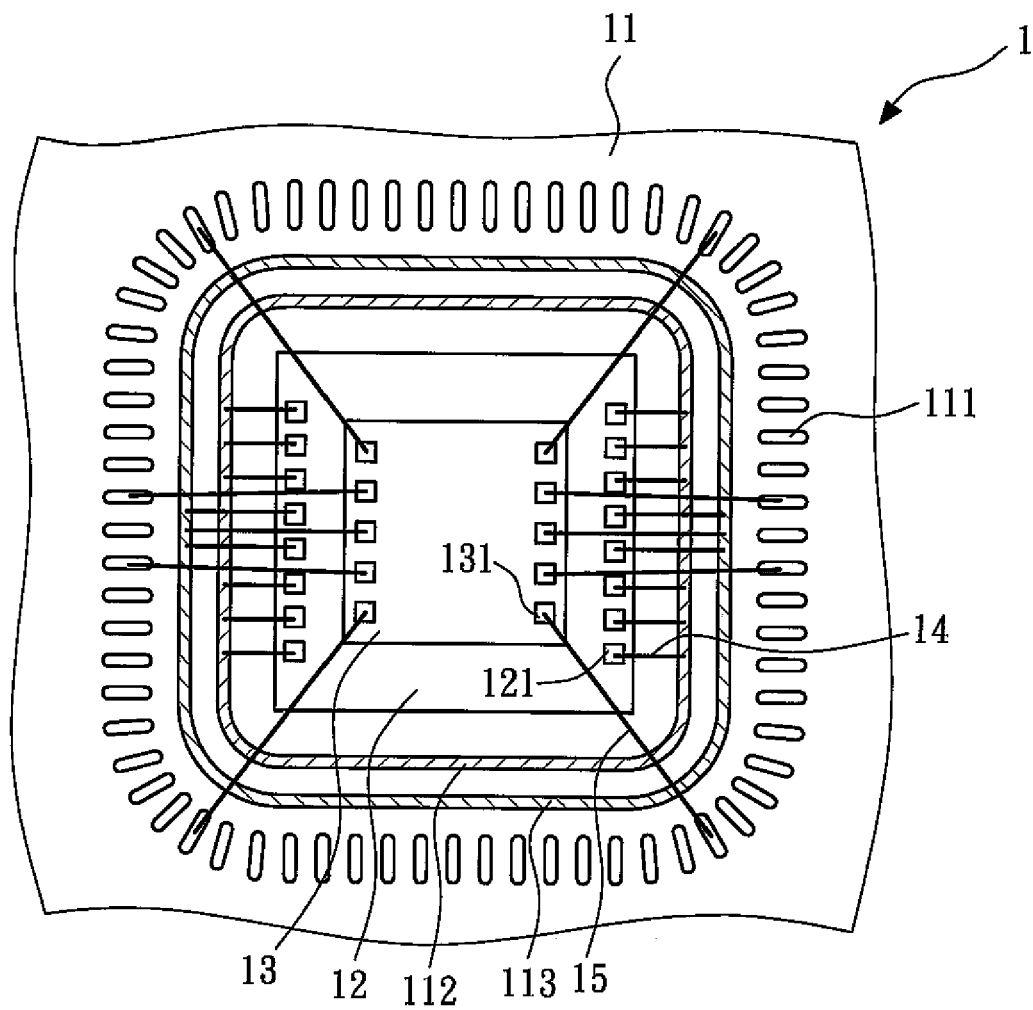
FIG. 1 is a schematic top view of a conventional stacked semiconductor package without a molding compound.
Figure 2:
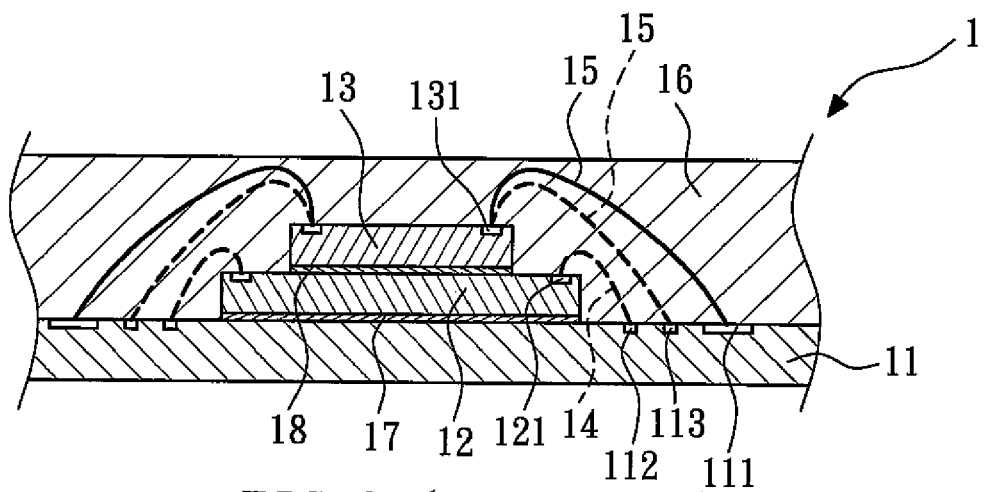
FIG. 2 is a schematic cross-sectional view of the conventional stacked semiconductor package.
Figure 3:
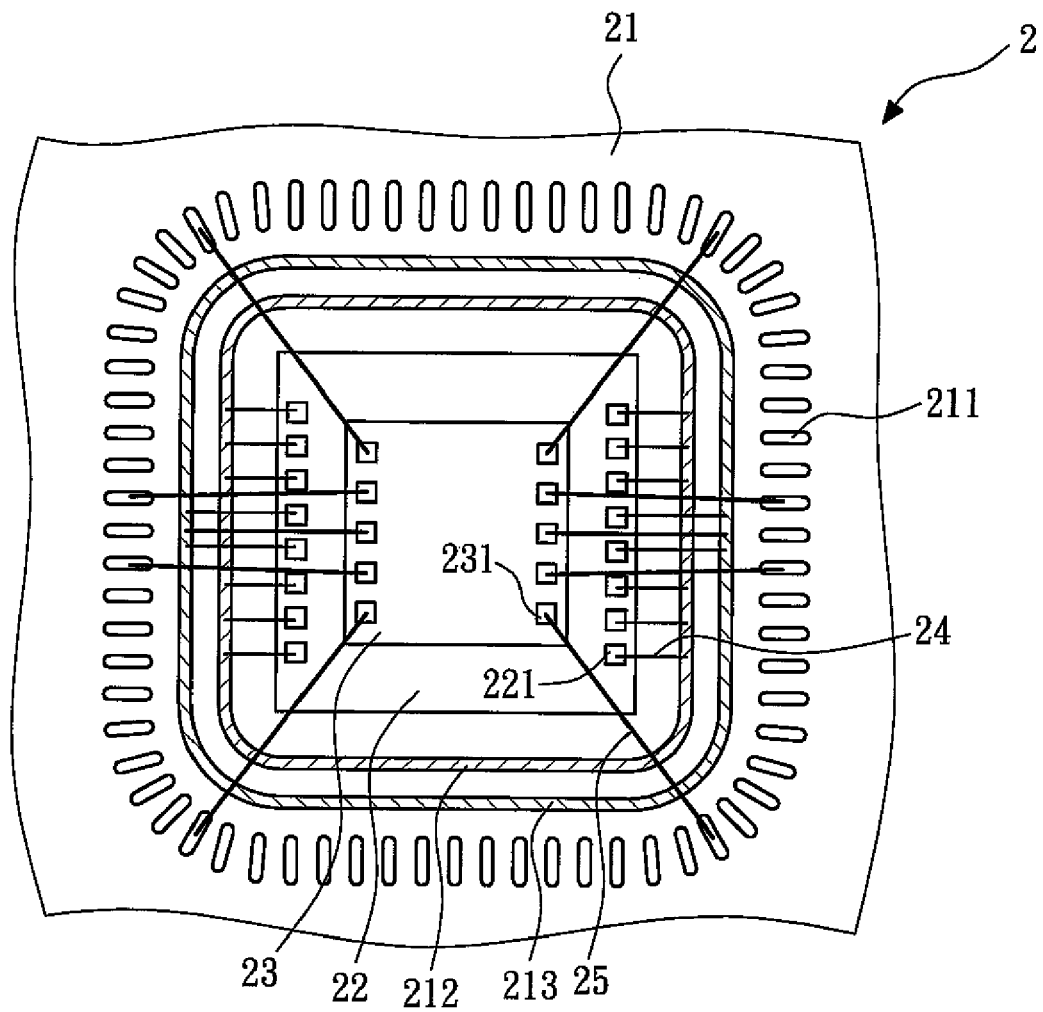
FIG. 3 is a schematic top view of a stacked semiconductor package according to example 1 of the present invention without the molding compound.
Figure 4:
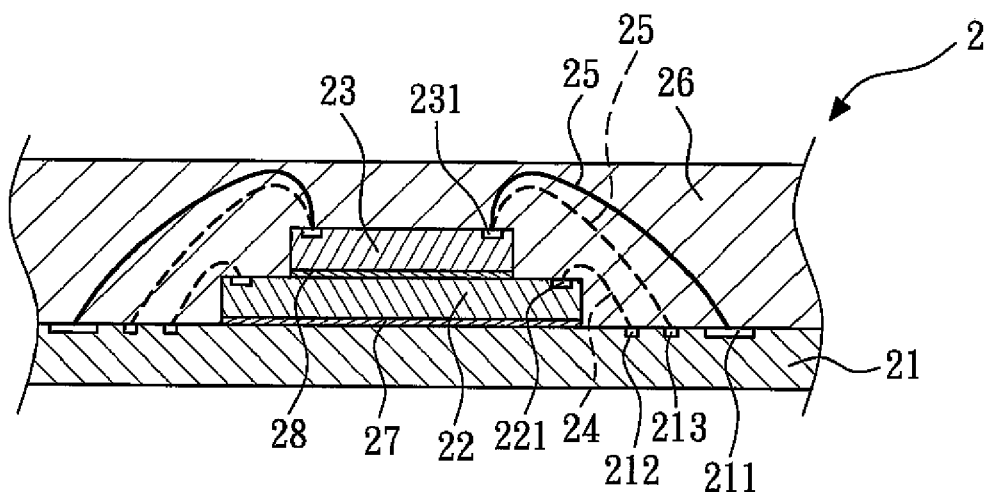
FIG. 4 is a schematic cross-sectional view of a stacked semiconductor package according to example 1 of the present invention.

FIG. 3 shows a top view of a stacked semiconductor package according to example 1 of the present invention without the molding compound. FIG. 4 shows a cross-sectional view of a stacked semiconductor package according to example 1 of the present invention. The stacked semiconductor package 2 comprises a substrate 21, a first die 22, a second die 23, a plurality of first wires 24, a plurality of second wires 25 and a molding compound 26.

The upper surface of the substrate 21 has a plurality of fingers 211, a ground ring 212 and a power ring 213. The fingers 211, the ground ring 212 and the power ring 213 surround the first die 22 and the second die 23. The lower surface of the first die 22 is adhered to the upper surface of the substrate 21 by an adhesive 27. The upper surface of the first die 22 has a plurality of first pads 221. The first wires 24 electrically connect the first pads 221 and the ground ring 212 or the power ring 213.

The lower surface of the second die 23 is adhered to the upper surface of the first die 22 by an adhesive 28. The upper surface of the second die 23 has a plurality of second pads 231. The second wires 25 electrically connect the second pads 231 and the fingers 211 or the power ring 213. The lengths of the second wires 25 are larger than those of the first wires 24, and the diameters of the second wires 25 are larger than those of the first wires 24.

The molding compound 26 encapsulates the upper surface of the substrate 21, the first die 22, the second die 23, the fingers 211, the ground ring 212, the power ring 213, the first wires 24 and the second wires 25.

Example 2

Figure 5:
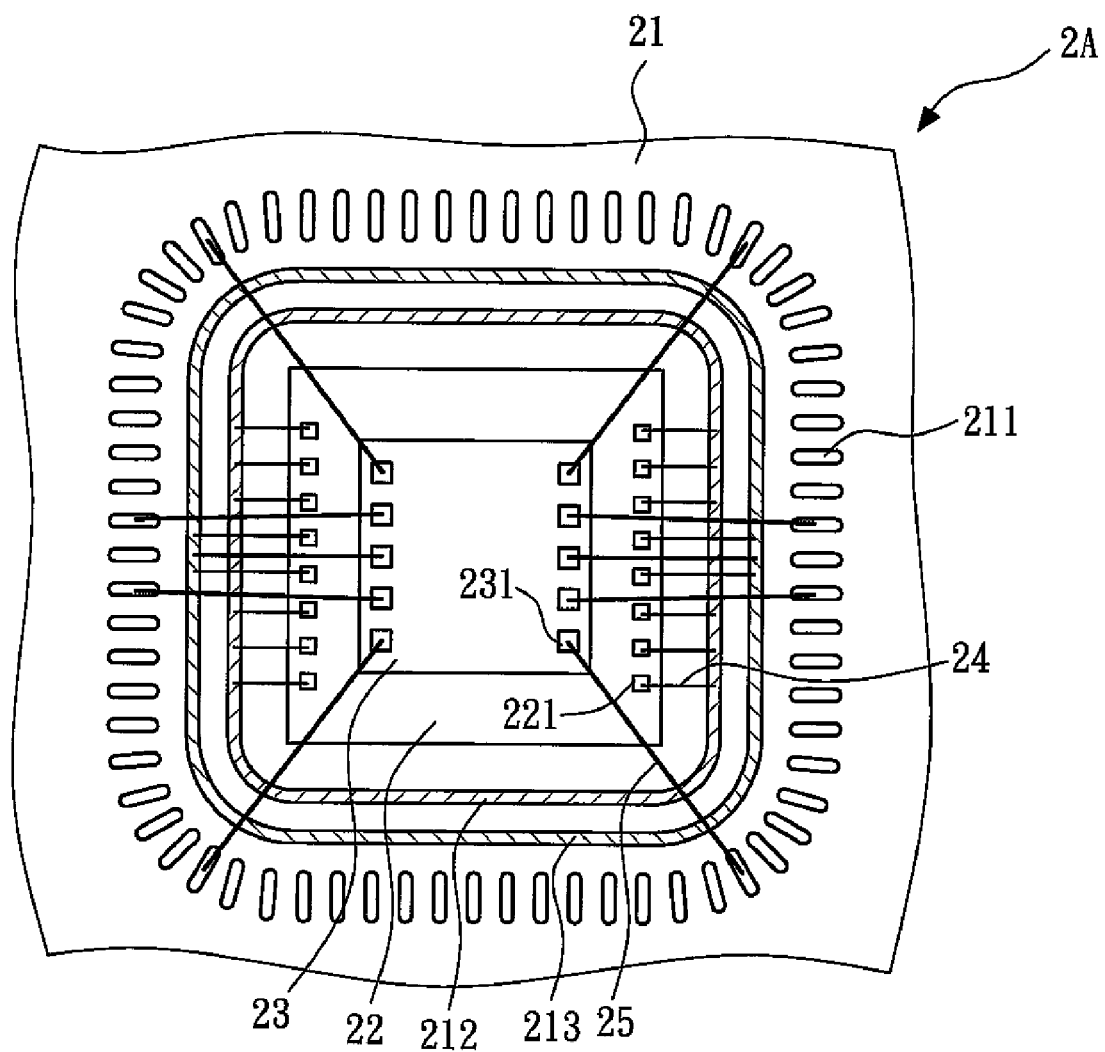
FIG. 5 is a schematic top view of a stacked semiconductor package according to example 2 of the present invention without the molding compound.

FIG. 5 shows a top view of a stacked semiconductor package according to example 2 of the present invention without the molding compound. The stacked semiconductor package 2A of the example is substantially the same as the stacked semiconductor package 2 of example 1, except that the areas of the first pads 221 in the example are smaller than those of the second pads 231.

Example 3

Figure 6:
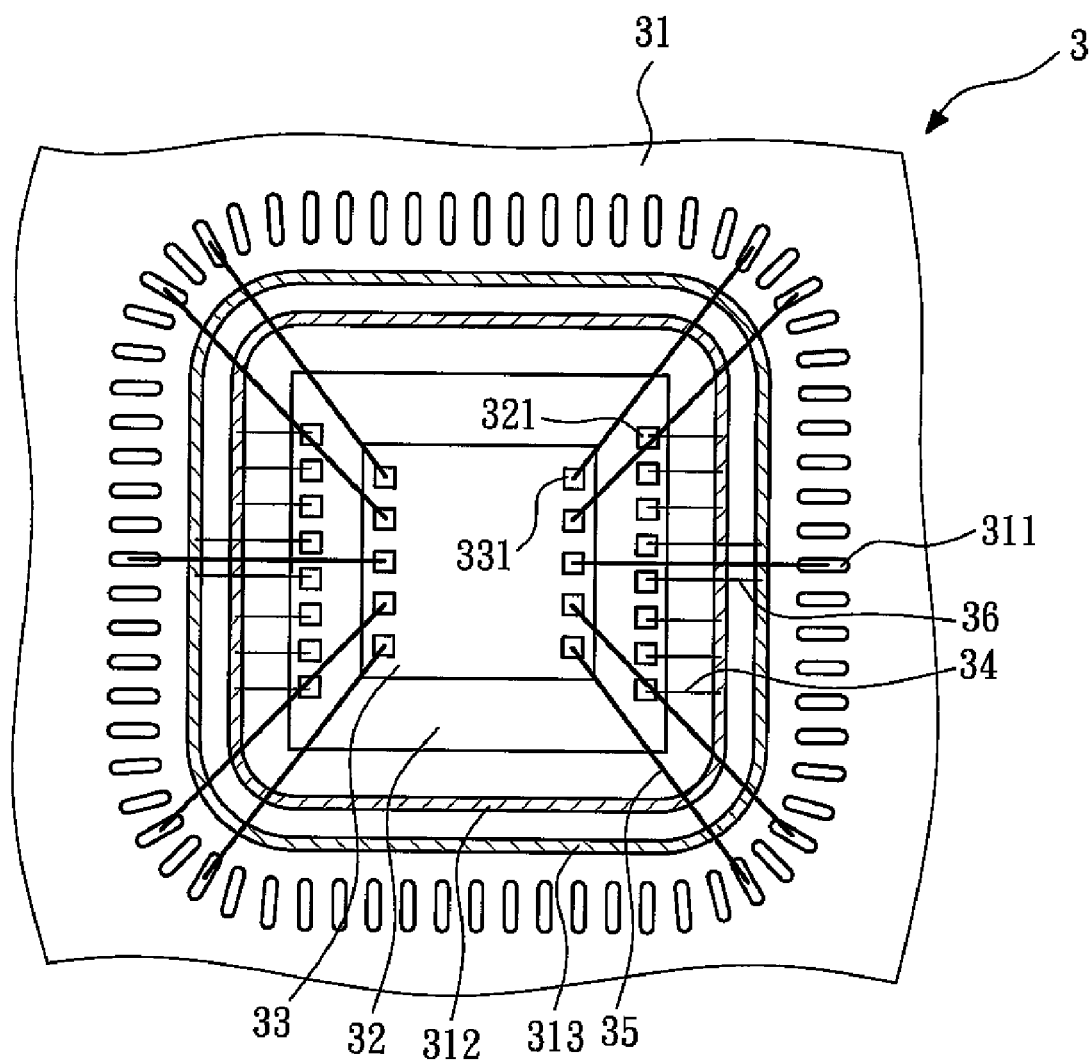
FIG. 6 is a schematic top view of a stacked semiconductor package according to example 3 of the present invention without the molding compound.

FIG. 6 shows a top view of a stacked semiconductor package according to example 3 of the present invention without the molding compound. The stacked semiconductor package 3 comprises a substrate 31, a first die 32, a second die 33, a plurality of first wires 34, a plurality of second wires 35, a plurality of third wires 36 and a molding compound (not shown).

The upper surface of the substrate 31 has a plurality of fingers 311, a ground ring 312 and a power ring 313. The fingers 311, the ground ring 312 and the power ring 313 surround the first die 32 and the second die 33. The lower surface of the first die 32 is adhered to the upper surface of the substrate 31 by an adhesive (not shown). The upper surface of the first die 32 has a plurality of first pads 321. The first wires 34 electrically connect the first pads 321 and the ground ring 312. The third wires 36 electrically connect the first pads 321 and the power ring 313.

The lower surface of the second die 33 is adhered to the upper surface of the first die 32 by an adhesive. The upper surface of the second die 33 has a plurality of second pads 331. The second wires 35 electrically connect the second pads 331 and the fingers 311. The lengths of the second wires 35 are larger than those of the third wires 36, and the lengths of the third wires 36 are larger than those of the first wires 34. The diameters of the second wires 35 are larger than those of the third wires 36, and the diameters of the third wires 36 are larger than those of the first wires 34. It is understood that the third wires 36 may electrically connect the second pads 331 and the power ring 313 in the example.

Example 4

Figure 7:
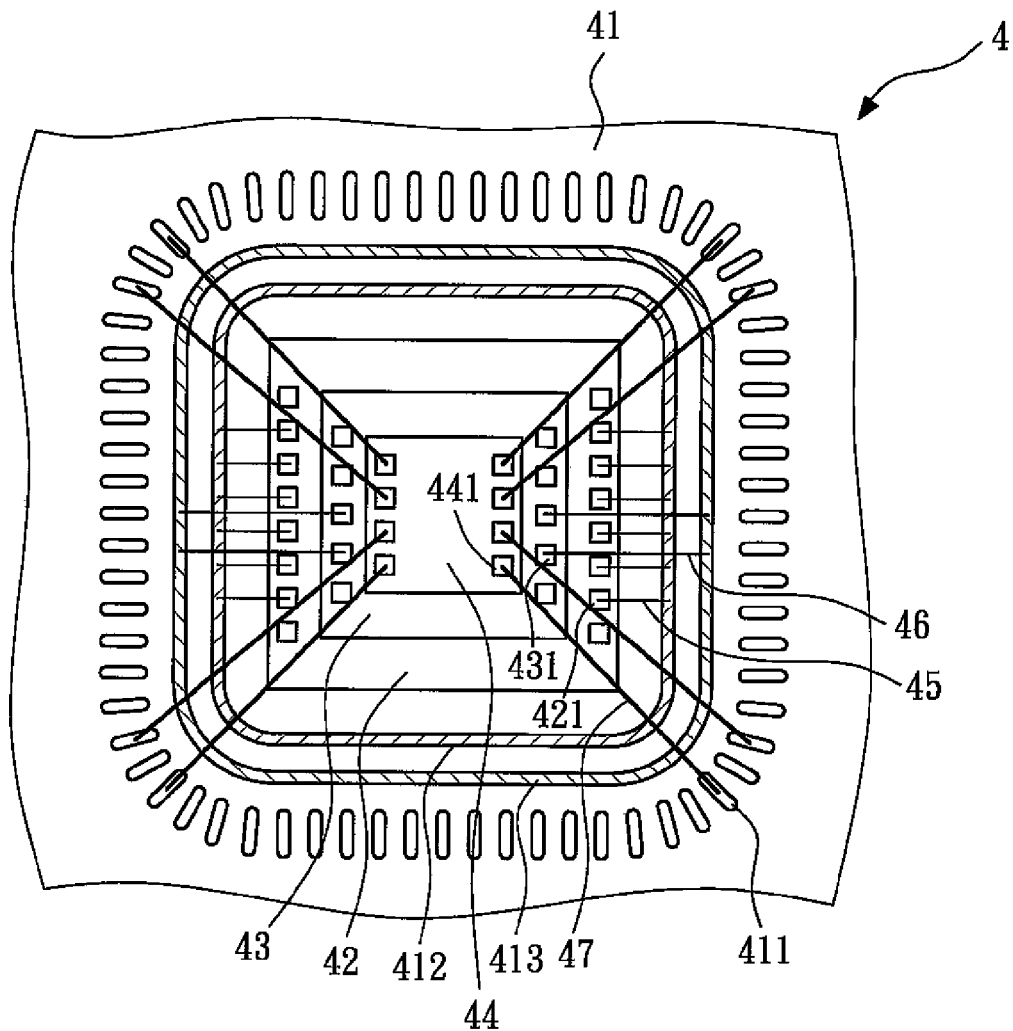
FIG. 7 is a schematic top view of a stacked semiconductor package according to example 4 of the present invention without the molding compound.
Figure 8:
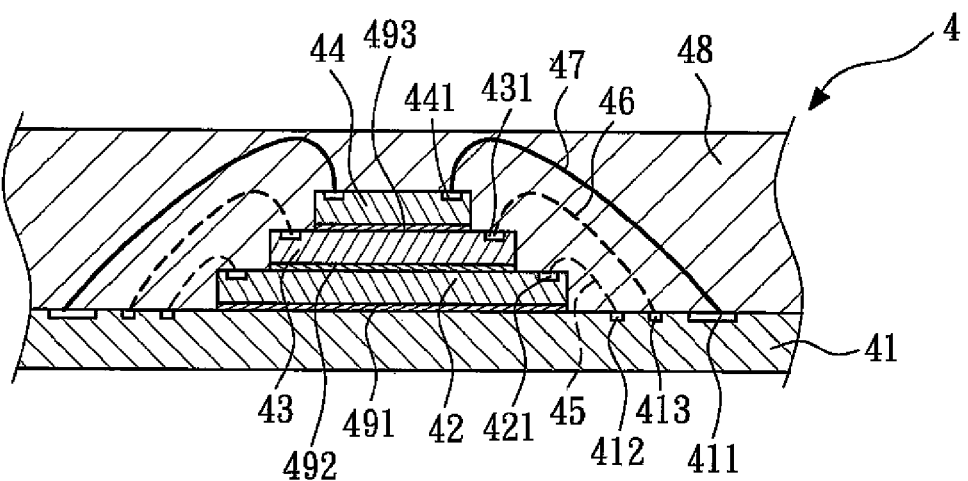
FIG. 8 is a schematic cross-sectional view of a stacked semiconductor package according to example 4 of the present invention.

FIG. 7 shows a top view of a stacked semiconductor package according to example 4 of the present invention without the molding compound. FIG. 8 shows a cross-sectional view of a stacked semiconductor package according to example 4 of the present invention. The stacked semiconductor package 4 comprises a substrate 41, a first die 42, a second die 43, a third die 44, a plurality of first wires 45, a plurality of second wires 46, a plurality of third wires 47 and a molding compound 48.

The upper surface of the substrate 41 has a plurality of fingers 411, a ground ring 412 and a power ring 413. The fingers 411, the ground ring 412 and the power ring 413 surround the first die 42, the second die 43 and the third die 44. The lower surface of the first die 42 is adhered to the upper surface of the substrate 41 by an adhesive 491. The upper surface of the first die 42 has a plurality of first pads 421. The first wires 45 electrically connect the first pads 421 and the ground ring 412.

The lower surface of the second die 43 is adhered to the upper surface of the first die 42 by an adhesive 492. The upper surface of the second die 43 has a plurality of second pads 431. The second wires 46 electrically connect the second pads 431 and the power ring 413. The lower surface of the third die 44 is adhered to the upper surface of the second die 43 by an adhesive 493. The upper surface of the third die 44 has a plurality of third pads 441. The third wires 47 electrically connect the third pads 441 and the fingers 411.

The lengths of the third wires 47 are larger than those of the second wires 46, and the lengths of the second wires 46 are larger than those of the first wires 45. The diameters of the third wires 47 are larger than those of the second wires 46, and the diameters of the second wires 46 are larger than those of the first wires 45.

The molding compound 48 encapsulates the upper surface of the substrate 41, the first die 42, the second die 43, the third die 44, the fingers 411, the ground ring 412, the power ring 413, the first wires 45, the second wires 46 and the third wires 47.

In the example, the areas of the first pads 421, the second pads 431 and the third pads 441 are the same. It is understood that the areas of the first pads 421 may be smaller than those of the second pads 431, and the areas of the second pads 431 may be smaller than those of the third pads 441.

Example 5

Figure 9:
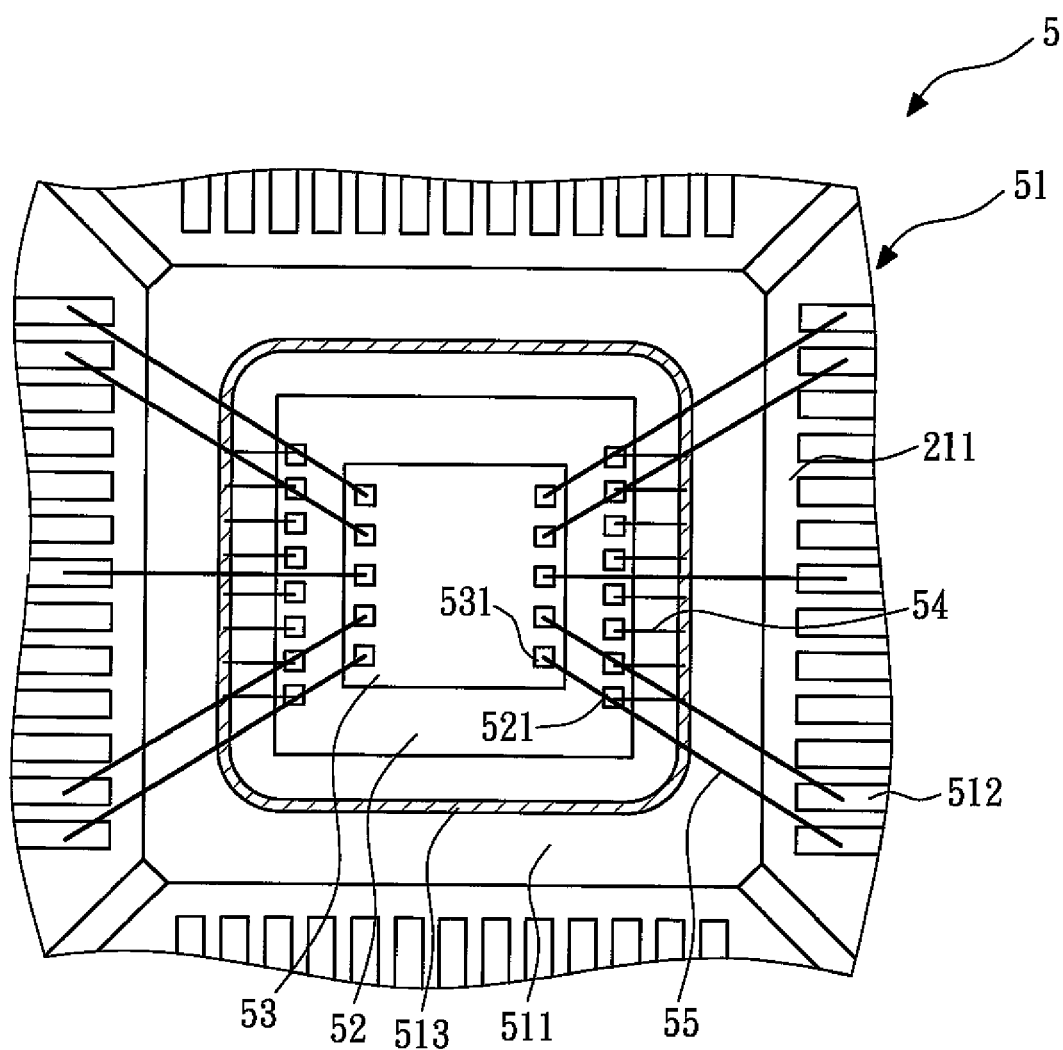
FIG. 9 is a schematic top view of a stacked semiconductor package according to example 5 of the present invention without the molding compound.
Figure 10:
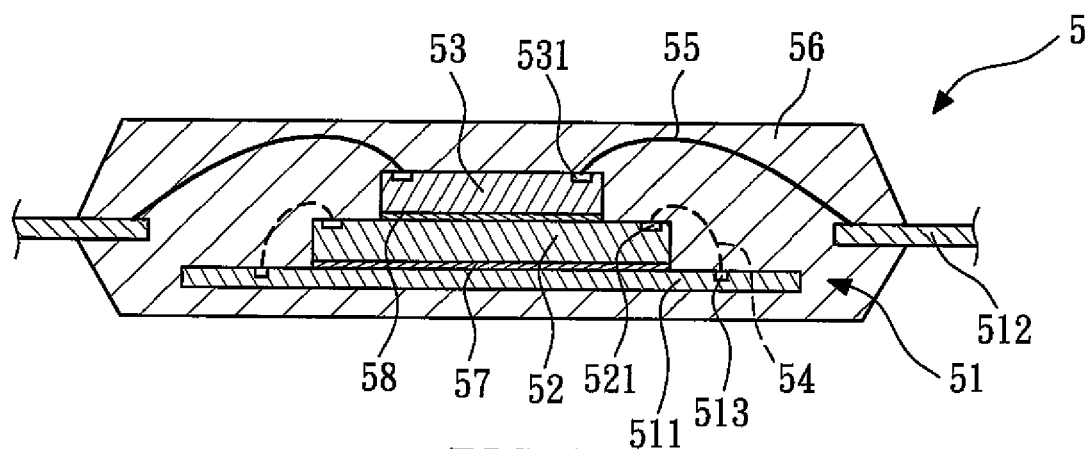
FIG. 10 is a schematic cross-sectional view of a stacked semiconductor package according to example 5 of the present invention.

FIG. 9 shows a top view of a stacked semiconductor package according to example 5 of the present invention without the molding compound. FIG. 10 shows a cross-sectional view of a stacked semiconductor package according to example 5 of the present invention. The stacked semiconductor package 5 comprises a leadframe 51, a first die 52, a second die 53, a plurality of first wires 54, a plurality of second wires 55 and a molding compound 56.

The leadframe 51 has a die pad 511 and a plurality of leads 512. The leads 512 surround the die pad 511. The lower surface of the first die 52 is adhered to the upper surface of the die pad 511 by an adhesive 57. The die pad 511 has a ground ring 513, which surrounds the first die 52. The upper surface of the first die 52 has a plurality of first pads 521. The first wires 54 electrically connect the first pads 521 and the ground ring 513.

The lower surface of the second die 53 is adhered to the upper surface of the first die 52 by an adhesive 58. The upper surface of the second die 53 has a plurality of second pads 531. The second wires 55 electrically connect the second pads 531 and the leads 512. The lengths of the second wires 55 are larger than those of the first wires 54, and the diameters of the second wires 55 are larger than those of the first wires 54.

The molding compound 56 encapsulates the die pad 511 of the leadframe 51, the first die 52, the second die 53, the leads 512, the ground ring 513, the first wires 54 and the second wires 55.

While several embodiments of the present invention have been illustrated and described, various modifications and improvements can be made by those skilled in the art. The embodiments of the present invention are therefore described in an illustrative but not restrictive sense. It is intended that the present invention should not be limited to the particular forms as illustrated, and that all modifications which maintain the spirit and scope of the present invention are within the scope defined in the appended claims.

What is claimed is:

1. A stacked semiconductor package, comprising:
a carrier, having a plurality of electrically connecting portions, wherein the carrier is a substrate, the electrically connecting portions comprise a plurality of fingers, a ground ring and a power ring;
a first semiconductor device, having a plurality of first pads, wherein the first semiconductor device is a first die;
a second semiconductor device, having a plurality of second pads, and disposed on the first semiconductor device, wherein the second semiconductor device is a second die;
a plurality of first wires, electrically connecting the first pads of the first semiconductor device and the electrically connecting portions of the carrier; and
a plurality of second wires, electrically connecting the second pads of the second semiconductor device and the electrically connecting portions of the carrier, wherein the diameters of the second wires are larger than those of the first wires.

2. The stacked semiconductor package as claimed in claim 1, wherein the first wires electrically connect the first pads and the fingers, and the second wires electrically connect the second pads and the fingers.

3. The stacked semiconductor package as claimed in claim 1, wherein the first wires electrically connect the first pads and the ground ring and the power ring, and the second wires electrically connect the second pads and the fingers.

4. The stacked semiconductor package as claimed in claim 1, wherein the areas of the first pads are smaller than those of the second pads, and the lengths of the first wires are smaller than those of the second wires.

5. The stacked semiconductor package as claimed in claim 1, further comprising a third semiconductor device and a plurality of third wires, wherein the third semiconductor device is disposed on the second semiconductor device and has a plurality of third pads, and the third wires electrically connect the third pads of the third semiconductor device and the electrically connecting portions of the carrier, and the diameters of the third wires are different from those of the second wires.

6. The stacked semiconductor package as claimed in claim 5, wherein the third wires electrically connect the first pads of the first semiconductor device and the electrically connecting portions of the carrier.

7. A stacked semiconductor package, comprising:
a carrier, having a plurality of electrically connecting portions, wherein the carrier is a leadframe having a die pad, the electrically connecting portions comprise a plurality of leads, a ground ring and a power ring;
a first semiconductor device, having a plurality of first pads, wherein the first semiconductor device is a first die;
a second semiconductor device, having a plurality of second pads, and disposed on the first semiconductor device, wherein the second semiconductor device is a second die;
a plurality of first wires, electrically connecting the first pads of the first semiconductor device and the electrically connecting portions of the carrier; and
a plurality of second wires, electrically connecting the second pads of the second semiconductor device and the electrically connecting portions of the carrier, wherein the diameters of the second wires are larger than those of the first wires.

8. The stacked semiconductor package as claimed in claim 7, wherein the first wires electrically connect the first pads and the leads, and the second wires electrically connect the second pads and the leads.

9. The stacked semiconductor package as claimed in claim 7, wherein the first wires electrically connect the first pads and the ground ring and the power ring, and the second wires electrically connect the second pads and the leads.

10. The stacked semiconductor package as claimed in claim 7, wherein the areas of the first pads are smaller than those of the second pads, and the lengths of the first wires are smaller than those of the second wires.

11. The stacked semiconductor package as claimed in claim 7, further comprising a third semiconductor device and a plurality of third wires, wherein the third semiconductor device is disposed on the second semiconductor device and has a plurality of third pads, and the third wires electrically connect the third pads of the third semiconductor device and the electrically connecting portions of the carrier, and the diameters of the third wires are different from those of the second wires.

12. The stacked semiconductor package as claimed in claim 11, wherein the third wires electrically connect the first pads of the first semiconductor device and the electrically connecting portions of the carrier.

13. A stacked semiconductor package, comprising:
a carrier, having a plurality of electrically connecting portions, wherein the carrier is a substrate, the electrically connecting portions comprise a plurality of fingers, the first semiconductor device is a first die, and the second semiconductor device is a second die;
a first semiconductor device, having a plurality of first pads;
a second semiconductor device, having a plurality of second pads, and disposed on the first semiconductor device;
a plurality of first wires, electrically connecting the first pads of the first semiconductor device and the electrically connecting portions of the carrier;
a plurality of second wires, electrically connecting the second pads of the second semiconductor device and the electrically connecting portions of the carrier, wherein the diameters of the second wires are larger than those of the first wires;
a third semiconductor device, disposed on the second semiconductor device and having a plurality of third pads; and
a plurality of third wires, electrically connect the third pads of the third semiconductor device and the electrically connecting portions of the carrier, and the diameters of the third wires are different from those of the second wires.

14. The stacked semiconductor package as claimed in claim 13, wherein the carrier is a substrate, the electrically connecting portions comprise a plurality of fingers, a ground ring and a power ring, the first semiconductor device is a first die, and the second semiconductor device is a second die.

15. The stacked semiconductor package as claimed in claim 14, wherein the first wires electrically connect the first pads and the fingers, and the second wires electrically connect the second pads and the fingers.

16. The stacked semiconductor package as claimed in claim 14, wherein the first wires electrically connect the first pads and the ground ring and the power ring, and the second wires electrically connect the second pads and the fingers.

17. The stacked semiconductor package as claimed in claim 13, wherein the carrier is a leadframe having a die pad, the electrically connecting portions comprise a plurality of leads, a ground ring and a power ring, the first semiconductor device is a first die, and the second semiconductor device is a second die.

18. The stacked semiconductor package as claimed in claim 17, wherein the first wires electrically connect the first pads and the leads, and the second wires electrically connect the second pads and the leads.

19. The stacked semiconductor package as claimed in claim 17, wherein the first wires electrically connect the first pads and the ground ring and the power ring, and the second wires electrically connect the second pads and the leads.

20. The stacked semiconductor package as claimed in claim 14, wherein the areas of the first pads are smaller than those of the second pads, and the lengths of the first wires are smaller than those of the second wires.

* * * * *